US007997841B2

(12) United States Patent
Show et al.

(10) Patent No.: US 7,997,841 B2
(45) Date of Patent: Aug. 16, 2011

(54) ELECTRONIC DEVICE AND FIXTURE FOR SAME

(75) Inventors: Un-Chi Show, Taipei Hsien (TW); Chun-Hua Wang, Taipei Hsien (TW); Chih-Chien Tsai, Taipei Hsien (TW); Yu-Chieh Liao, Taipai Hsien (TW); Chau-Lin Chang, Taipei Hsien (TW)

(73) Assignee: Foxnum Technology Co., Ltd., Tu-Cheng, New Taipei (TW)

( * ) Notice: Subject to any disclaimer, the term of this patent is extended or adjusted under 35 U.S.C. 154(b) by 410 days.

(21) Appl. No.: 12/233,835

(22) Filed: Sep. 19, 2008

(65) Prior Publication Data

US 2009/0290958 A1   Nov. 26, 2009

(30) Foreign Application Priority Data

May 26, 2008 (CN) .......................... 2008 1 0301776

(51) Int. Cl.
*F16B 21/02* (2006.01)
(52) U.S. Cl. ........................................ 411/349; 411/508
(58) Field of Classification Search .................. 411/349, 411/549, 553, 508, 913
See application file for complete search history.

(56) References Cited

U.S. PATENT DOCUMENTS

| 2,177,215 | A | * | 10/1939 | Hodgkinson | .................... | 40/200 |
| 3,009,381 | A | * | 11/1961 | Rapata | ........................... | 411/337 |
| 3,480,311 | A | * | 11/1969 | Lanham, Jr. | ............... | 403/408.1 |
| 3,588,968 | A | * | 6/1971 | Heilman | ......................... | 11/548 |
| 4,740,026 | A | * | 4/1988 | Wagner | ......................... | 296/39.2 |
| 4,893,978 | A | * | 1/1990 | Frano | ............................. | 411/553 |
| 5,123,795 | A | * | 6/1992 | Engel et al. | ................... | 411/552 |
| 5,143,500 | A | * | 9/1992 | Schuring et al. | .............. | 411/339 |
| 5,419,713 | A | * | 5/1995 | Northey | ......................... | 439/567 |
| 5,616,052 | A | * | 4/1997 | Pan et al. | ...................... | 439/573 |
| 6,530,629 | B2 | * | 3/2003 | Shyr | ......................... | 312/223.2 |

\* cited by examiner

*Primary Examiner* — Flemming Saether
(74) *Attorney, Agent, or Firm* — Clifford O. Chi

(57) ABSTRACT

An electronic device includes a panel, a main body, a button, and a fastener. The panel defines a hole. The main body defines a quadrate through hole. The button resists against the panel, opposite to the main body. The fastener includes an elastic head at a first end and a block at an opposite second end. The elastic head passes through the hole of the panel to be fixed to the button, the block passes through the quadrate through hole of the main body. A panel fixture for the electronic device is provided as well.

7 Claims, 5 Drawing Sheets

ELECTRONIC DEVICE AND FIXTURE FOR SAME

BACKGROUND

1. Field of the Invention

The present invention relates to electronic devices and their fixing structures and, particularly, to an electronic device and a structure for fixing a panel of the electronic device.

2. Description of Related Art

Electronic devices are generally constructed with panels and components tied together via screws. Installing and disassembling the panels and components require external tools such as screwdrivers. Installing and removing the screws become inconvenient and time consuming. In addition, the removed screws tend to be lost easily.

A need exists in the industry to provide an electronic device having easy and reliable panel fixture.

SUMMARY

An electronic device includes a panel, a main body, a button, and a fastener. The panel defines a hole. The main body defines a quadrate through hole. The button resists against the panel, opposite to the main body. The fastener includes an elastic head at a first end and a block at an opposite second end. The elastic head extends through the hole of the panel to be fixed to the button, the block extends through the quadrate through hole of the main body.

DETAILED DESCRIPTION

Figure 1:
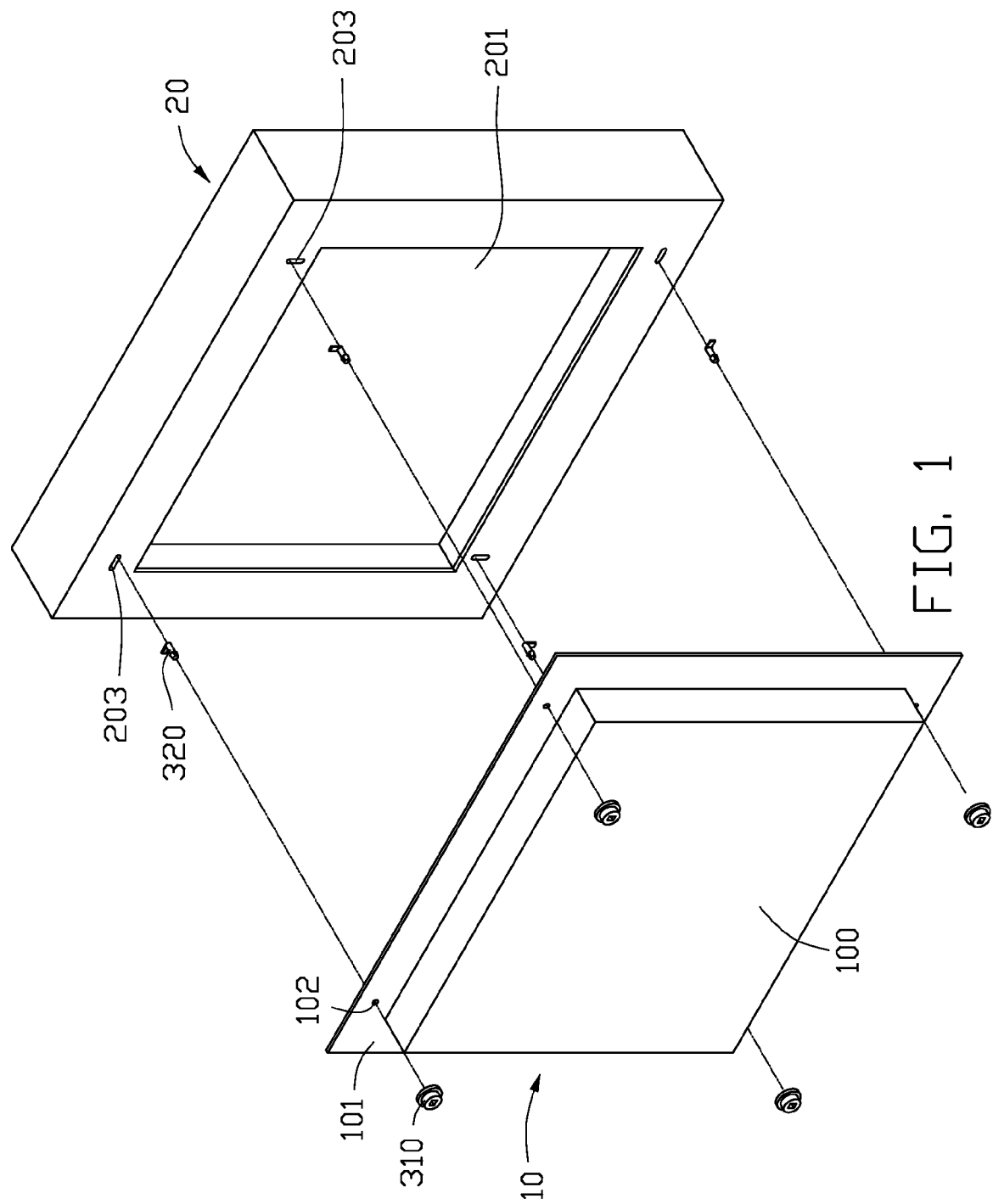
FIG. 1 is an exploded, isometric view of an embodiment of an electronic device, the electronic device includes a main body, a panel, and a plurality of panel fixtures.

Referring to FIG. 1, an embodiment of an electronic device includes a main body 20, a panel 10, and four panel fixtures. Each panel fixture includes a button 310 and a fastener 320.

The main body 20 defines a quadrate through hole 201. Four long fixing holes 203 are defined in four corners of the main body 20 around the through hole 201. A lengthways direction of each fixing hole 203 is angled relative to lengthways directions of its neighboring fixing holes 203. In the illustrated embodiment, the lengthways direction of each fixing hole 203 is perpendicular to the lengthways directions of its neighboring fixing holes 203.

The panel 10 includes a quad rate main part 100 and a margin portion 101 extending from edges of the main part 100. The margin portion 101 defines four holes 102 in four corners of the margin portion 101. The panel 10 may be a LCD panel or a keypad.

Figure 2:
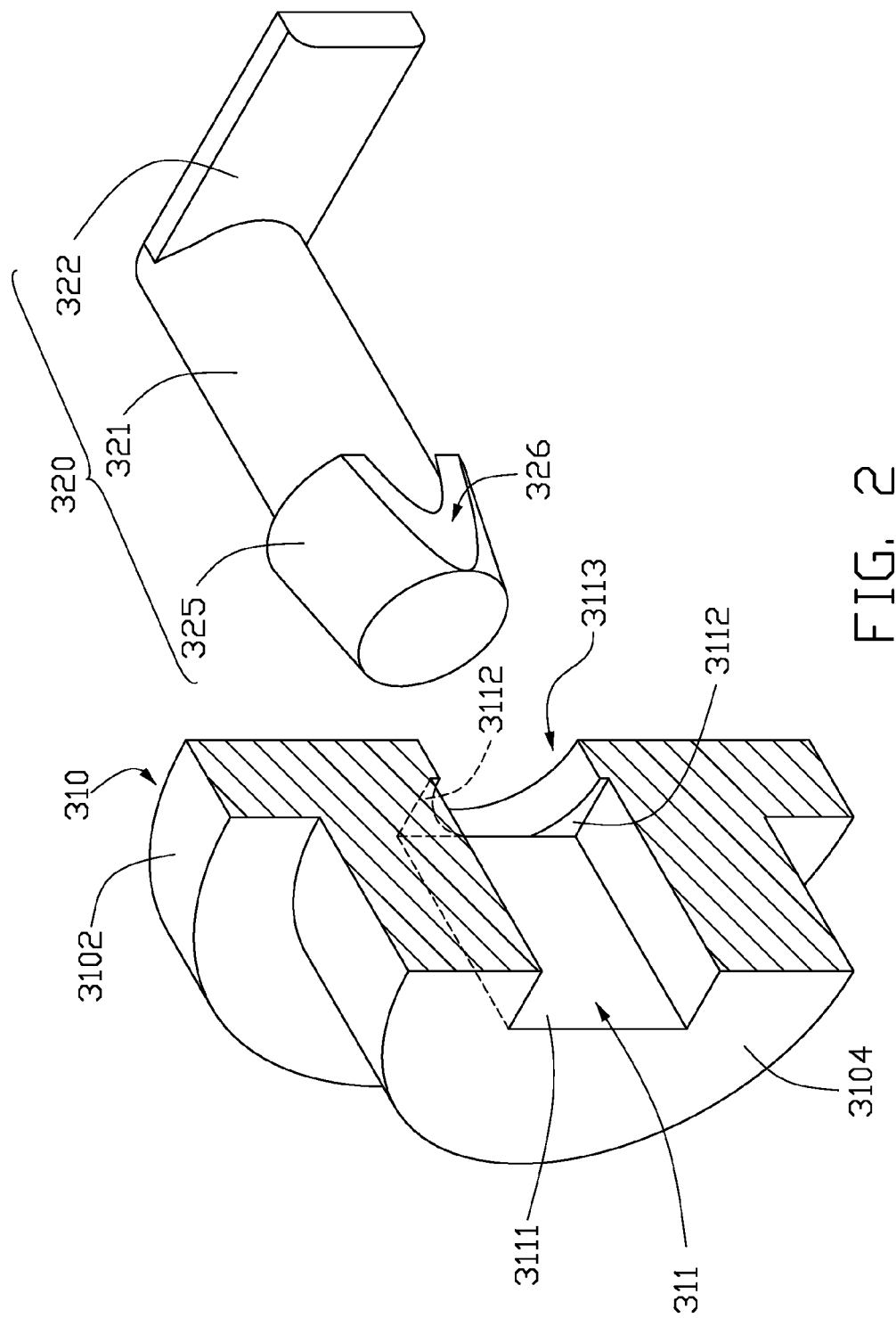
FIG. 2 shows an enlarged partial cross-sectional view of one of the panel fixtures of FIG. 1.

Referring to FIG. 2, the button 310 of each panel fixture is generally T-shaped and includes two coaxial cylindrical portions 3102, 3104. A diameter of the cylinder portion 3102 is greater than a diameter of the cylinder portion 3104. The button 310 defines a through hole 311 along an axial direction. The through hole 311 includes a cube-shaped first part 3111 defined in the cylinder portion 3104, and a cylindrical second part 3113 defined in the cylinder portion 3102. The cube-shaped first part 3111 has a rectangular cross-section. The cylindrical second part 3113 has a circular cross-section whose diameter is smaller than a longest length, while larger than a shortest length of the rectangular cross-section of the first part 3111. As a result, a stop portion 3112 is formed on a wall of the first part 3111 at the intersection of the first part 3111 and the second part 3113.

The fastener 320 includes a cylindrical body 321, a block 322 perpendicularly connected to a first end of the body 321, and a taper-shaped elastic head 325 connected to a second end of the body 321. A diameter of the largest portion of the head 325 is greater than the diameter of the second part 3113 of the through hole 311. Two opposite flat surfaces 326 parallel to an axial direction of the body 321 are formed on a circumference of the head 325.

Figure 3:
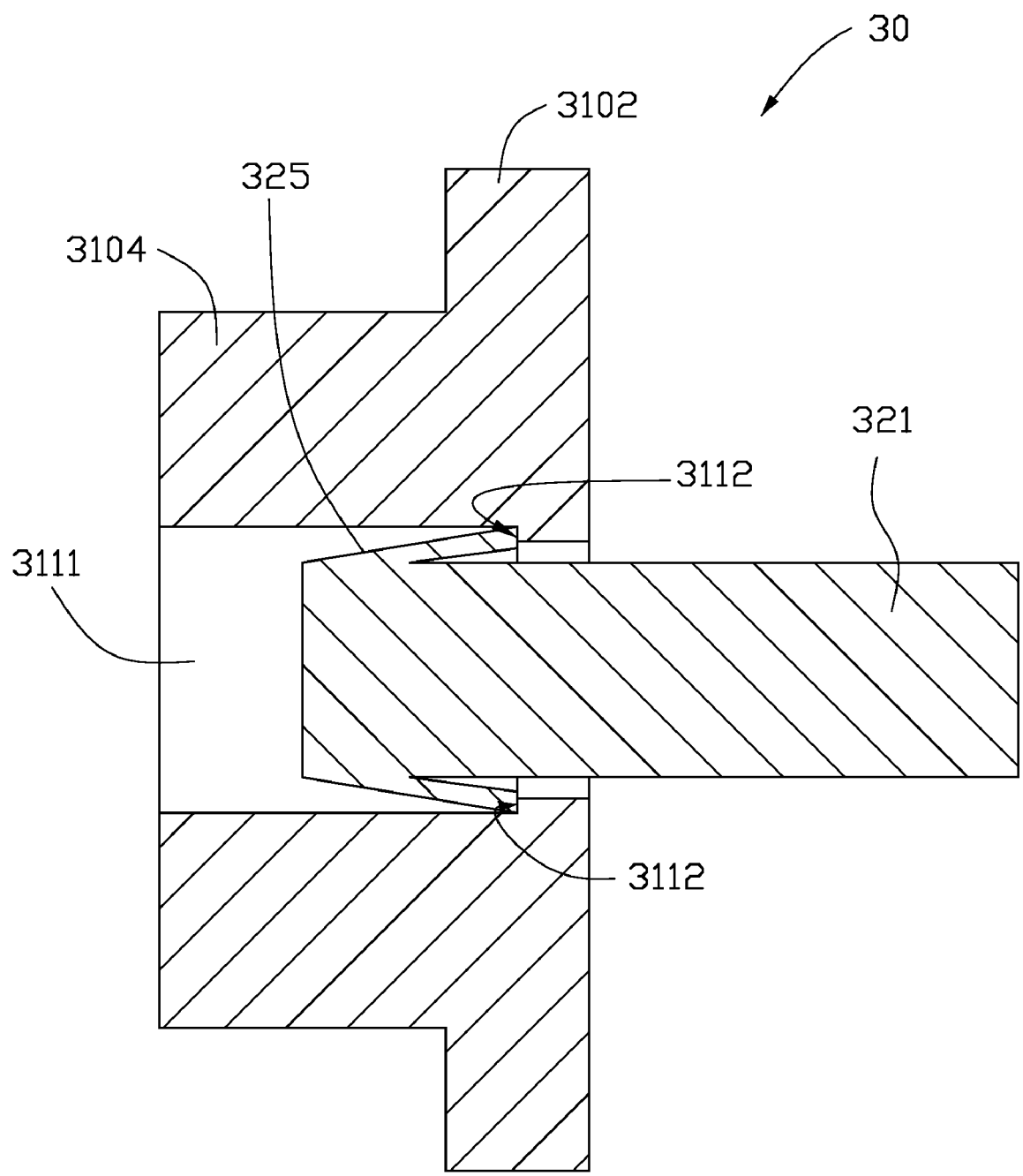
FIG. 3 shows a cross-sectional, assembled view of the panel fixture of FIG. 2.
Figure 4:
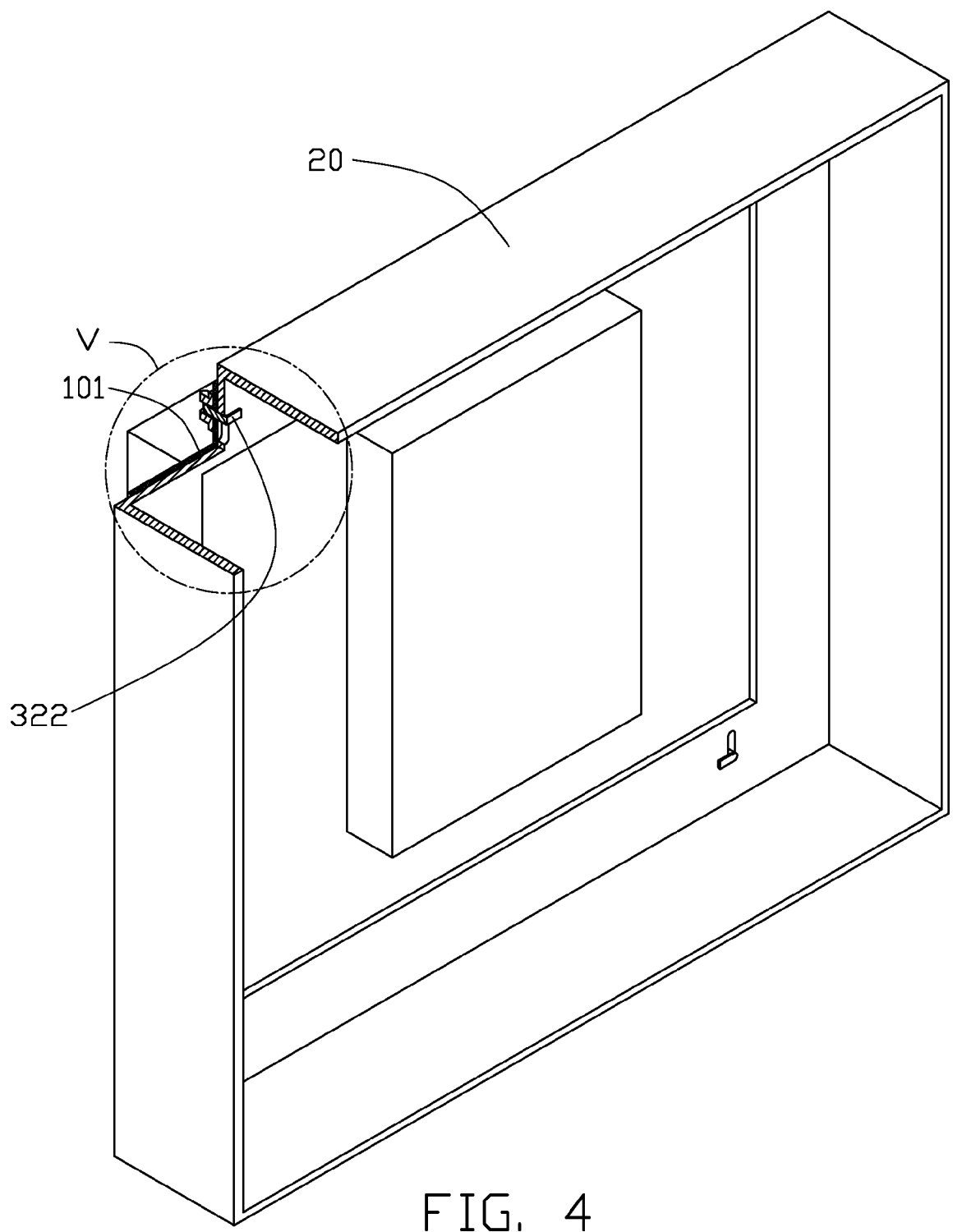
FIG. 4 is an assembled, partially cutaway view of the electronic device of FIG. 1, but from a different perspective.
Figure 5:
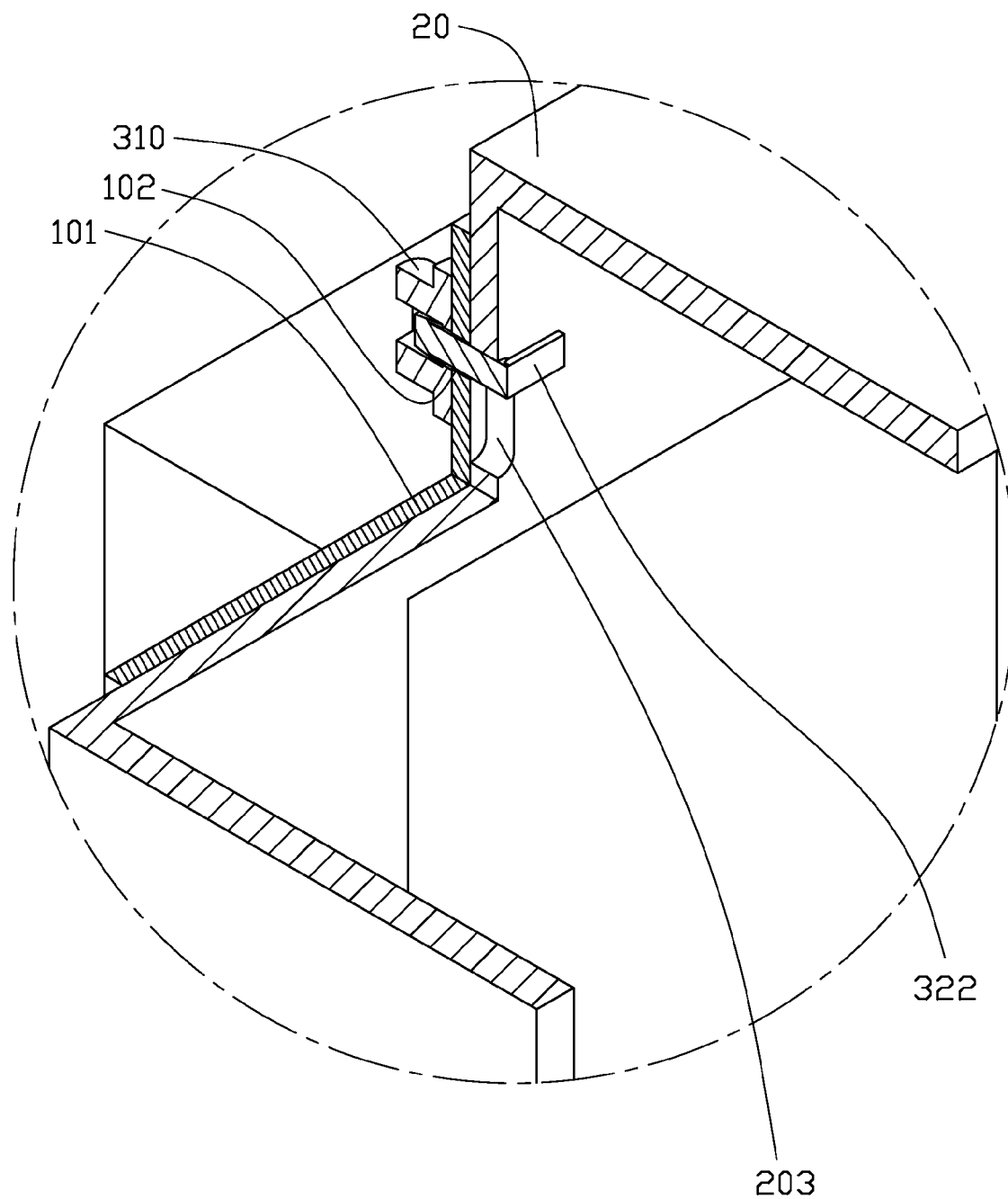
FIG. 5 is an enlarged view of a circled part V of FIG. 4.

Referring to FIGS. 3 through 5, in assembling the panel fixtures to the panel 10, the head 325 of each fastener 320 is elastically compressed to extend through the hole 102 of the panel 10 from a back of the panel 10 and the second part 3113 of the through hole 311. After entering the first part 3111 of the through hole 311, the head 325 restores to resist against an inner wall of the first part 3111. The fastener 320 is fixed to the button 310 and will not separate from the button 310, because the stop portion 3112 of the button 310 prevents the head 325 from extending through the second part 3113, and the flat surfaces 326 are resisting against walls of the first part 3111. In addition, the block 322 prevents the fastener 320 from extending through towards the first part 3111.

The panel 10 is attached to the main body 20 by aligning the blocks 322 of the fasteners 320 with the fixing holes 203 of the main body 20. The buttons 310 are rotated to adjust the angle of the lengthways directions of the blocks 322 until the lengthways directions of the blocks are parallel to the lengthways directions of the fixing holes 203 so that the blocks 322 can extend through the fixing holes 203. After the blocks 322 extend through the fixing holes 203, the buttons 310 are rotated to drive the blocks 322 to rotate, until the lengthways directions of the blocks 322 are no longer parallel to the lengthways directions of the fixing holes 203. As a result, the blocks 322 cannot extend through the fixing holes 203. Ideally, the blocks 322 are perpendicularly to the lengthways directions of the fixing holes 203. The cylindrical body 321 of each fastener 320 is received in the corresponding hole 102 of the panel 10 and the corresponding fixing hole 203 of the main body 20. The block 322 of the fastener 320 resists against the main body 20 and the head 325 of the button 310 resists against the panel 10, to tightly sandwich the main body 20 and the panel 10. Thus, the panel 10 is tightly fixed to the main body 20.

The lengthways direction of each fixing hole 203 is angled relative to its neighboring fixing holes 203 to prevent unwanted movements of the panel 10 with respective to the main body 20 and unintentional disassembly. In disassembly, the buttons 310 are rotated until the lengthways directions of the blocks 322 are aligned with the lengthways directions of the corresponding fixing holes 203. As a result, the blocks 322 can disengage from the fixing holes 203. Thus, the panel 10 can be detached from the main body 20, while the buttons 310 and the fasteners 320 are still fixed to each other.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electronic device comprising:
   a panel defining a hole;
   a main body defining a fixing hole;
   a button resisting against the panel, opposite to the main body, wherein the button defines a through hole; and
   a fastener comprising an elastic head at a first end and a block at an opposite second end wherein the elastic head extends through the hole of the panel to be fixed to the button; the block extends through the fixing hole of the main body;
   wherein the through hole of the button comprises a cube-shaped first part and a cylindrical second part communicating with the first part, the second part having a cross-sectional area smaller than a cross-sectional area of the first part; a stop portion is formed in the first part at the intersection of the first part and the second part, to block the elastic head from disengaging from the button.

2. The electronic device of claim 1, wherein the elastic head has at least one flat surface to resist against a sidewall of the first part of the through hole of the button to fix the fastener to the button.

3. A fixture for fixing a first object to a second object, comprising:
   a fastener comprising an elastic head at a first end and a block at a second end, wherein the elastic head extends through a first hole of the first object and the block extends through a second hole of the second object; the fastener is capable of rotating in the first hole and second hole; and
   a button defining a through hole for receiving the elastic head, wherein the button is configured to resist against the first object, and the block is configured to resist against the second object to sandwich the first and second objects;
   wherein the through hole of the button comprises a cube-shaped first part and a cylindrical second part communicating with the first part, the second part having a cross-sectional area smaller than a cross-sectional area of the first part; a stop portion is formed in the first part at the intersection of the first part and the second part, to block the elastic head from disengaging from the button.

4. The fixture of claim 3, wherein the elastic head is taper-shaped, a largest portion of the head resists against the stop portion and received in the first part.

5. The fixture of claim 3, wherein the elastic head has at least one flat surface for resisting against a sidewall of the first part.

6. The fixture of claim 3, wherein the fastener is coupled with the button such that the fastener is rotatable following the button.

7. The fixture of claim 3, wherein the block is perpendicular to an axial direction of the fastener.

* * * * *